United States Patent [19]

Norman

[11] Patent Number: 5,247,477
[45] Date of Patent: Sep. 21, 1993

[54] METHOD OF PROGRAMMING FLOATING GATE MEMORY DEVICES AIDED BY POTENTIAL APPLIED TO READ CHANNEL

[75] Inventor: Kevin A. Norman, Belmont, Calif.

[73] Assignee: Altera Corporation, San Jose, Calif.

[21] Appl. No.: 708,241

[22] Filed: May 31, 1991

[51] Int. Cl.[5] .................. G11C 11/34; G11C 7/00
[52] U.S. Cl. ........................... 365/185; 365/218; 257/322
[58] Field of Search ................ 365/185, 208; 257/322

[56] References Cited

U.S. PATENT DOCUMENTS

| | | | |
|---|---|---|---|
| 4,412,310 | 10/1983 | Korsh et al. | 365/218 |
| 5,022,001 | 6/1991 | Kowalski et al. | 265/218 |
| 5,122,985 | 6/1992 | Santin | 365/185 |
| 5,132,935 | 7/1992 | Ashmore, Jr. | 365/218 |
| 5,150,179 | 9/1992 | Gill | 365/185 |

OTHER PUBLICATIONS

B. Eitan et al., "Hot-Electron Injection into the Oxide in n-Channel MOS Devices," *IEEE Transactions on Electron Devices*, vol. ED-28, No. 3, Mar. 1981, pp. 328-340.

*Primary Examiner*—Rolf Hille
*Assistant Examiner*—S. V. Clark
*Attorney, Agent, or Firm*—Robert R. Jackson

[57] ABSTRACT

Improved methods of programming floating gate memory devices such as MOS EPROMs having a gate, a floating gate, a read channel, and a write or programming channel. Potential is applied to the read channel (which is normally inactive during programming) in order to increase the voltage induced on the floating gate by the programming voltage applied to the gate. This makes it possible to reduce the programming voltage which must be applied to the gate, to reduce the time required to program the device, or to achieve some measure of both of these benefits.

15 Claims, 2 Drawing Sheets

| $V_G$ | V4244 | V20 |
|---|---|---|
| 15 | 0 | 10.5 |
| 12.5 | 5 | 10.25 |
| 11.0 | 8 | 10.1 |
| 15 | 5 | 12 |
| 14 | 5 | 11.3 |

METHOD OF PROGRAMMING FLOATING GATE MEMORY DEVICES AIDED BY POTENTIAL APPLIED TO READ CHANNEL

BACKGROUND OF THE INVENTION

This invention relates to floating gate memory devices, and more particularly to methods of programming such memory devices. The invention is pertinent to floating gate devices with separately optimized read and programming transistors coupled by a common floating gate, and which further are programmed by gate currents in the programming-optimized transistor. See, for example, B. Eitan et al. "Hot-Electron Injection into the Oxide in n-Channel MOS Devices", *IEEE Transactions on Electron Devices*, Vol. ED-28, No. 3, Mar. 1981, pp. 328-40. The invention will be fully understood from the following explanation of it in the context of metal oxide semiconductor ("MOS") erasable programmable read-only memory ("EPROM") devices.

A typical MOS EPROM device which is programmable in accordance with this invention has a control gate (sometimes referred to simply as the gate), a floating gate, a source and drain pair for programming the device, and a source and drain pair for reading the programmed state of the device. The unprogrammed initial voltage condition of the floating gate is for the capacitance between the floating gate and the source to be relaxed (i.e., 0 volts) when the gate voltage $V_{cg}=0$. This initial condition is important because in a capacitive divider such as shown in FIG. 3 the potential of the floating gate $V_{fg}$ is given by the equation $V_{fg} = V_{fg}(\text{initial}) + (C1/(C1+C2))(V_{cg} - V_{cg}(\text{initial}))$.

The device is conventionally programmed by applying a relatively high voltage (e.g., 15 volts) to the gate and a somewhat lower voltage (e.g., 8 volts) to the programming drain, while holding the programming source at ground potential (i.e., 0 volts). Capacitive coupling between the control gate and the floating gate causes a change in the potential of the floating gate when the potential of the control gate is changed. For example, if the capacitive divide or coupling ratio is assumed to be 0.7 and both the control gate and the floating gate are initially at 0 volts, then raising the control gate to 15 volts causes the floating gate potential to rise to 10.5 volts. The programming transistor's channel begins to conduct a substantial current. Due to the very high field in the drain region, electron hole pairs are formed with a very high kinetic energy. Some of the electrons will have enough kinetic energy to be injected onto the floating gate where they are trapped. This in turn lowers the potential of the floating gate (e.g., to approximately 6.5 volts in the example being discussed), thereby "programming" the device.

When the control gate potential is lowered from 15 volts to 0 volts, the capacitive divider causes a 10.5 volt drop in potential from 6.5 volts to −4 volts on the floating gate. Because the floating gate transistor is an NMOS transistor with a threshold voltage of about 1 volt, the floating gate transistor is non-conducting. Furthermore, when the control gate is raised to 5 volts, there results a 3.5 volt rise on the floating gate to −0.5 voltage. The programmed transistor therefore remains off. In other words, the read channel of a programmed device is always off regardless of the normal logic level (0 or 5 volts) applied to the gate of the device. In an unprogrammed device (i.e., no negative charge on the floating gate), the read channel of the device is on or off depending on whether 5 volts or 0 volts, respectively, is applied to the gate of the device because the floating gate potential is respectively 3.5 volts (above the threshold) or 0 volts (below the threshold).

As floating gate devices are made smaller, their ability to withstand the relatively high voltages (e.g., the above-mentioned 15 volts) conventionally required to program them decreases. Accordingly, the ability to withstand these voltages has become a limitation on further device size reduction which would otherwise be possible and very advantageous.

It is therefore, an object of this invention to reduce the voltages required to program floating gate memory devices.

It is another object of this invention to reduce the time required to program floating gate memory devices.

SUMMARY OF THE INVENTION

These and other objects of the invention are accomplished in accordance with the principles of the invention by using the inherent capacitive coupling between the channel of the read device and the floating gate to increase the voltage on the floating gate during programming. In the example discussed above, a positive voltage (e.g., 5-10 volts) is applied to both the read source and the read drain during programming. This raises the potential of the floating gate beyond what can be achieved solely by applying a positive voltage to the gate as is conventional. Accordingly, the gate programming potential can be lowered (e.g., from 15 volts to 12.5 or even 10 volts), or programming time can be shortened, or a combination of these two advantages can be realized.

Further features of the invention, its nature and various advantages will be more apparent from the accompanying drawings and the following detailed description of the preferred embodiments.

DETAILED DESCRIPTION OF THE PREFERRED EMBODIMENTS

Figures 1, 2:
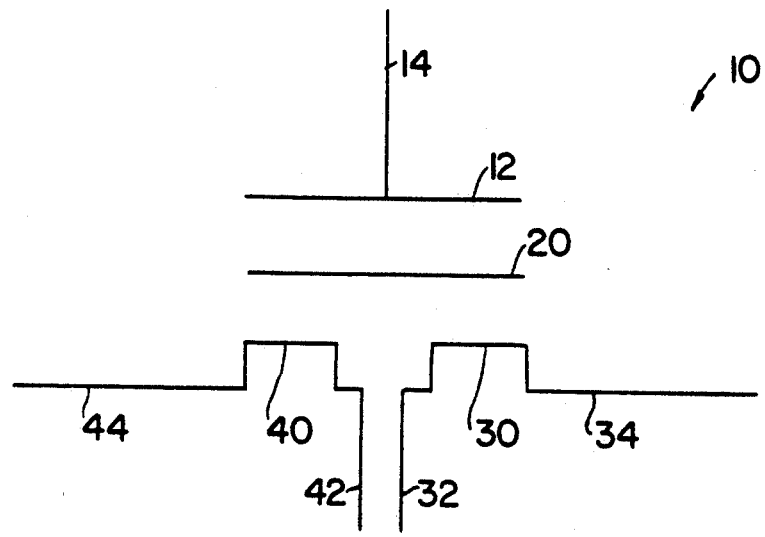
FIG. 1 is a simplified schematic diagram of an illustrative floating gate memory device which can be programmed in accordance with the method of this invention.
FIG. 2 is a chart of various possible voltages in the floating gate memory device shown in FIG. 1 during conventional programming (first line) and during programming in accordance with this invention (subsequent lines).
Figure 3:
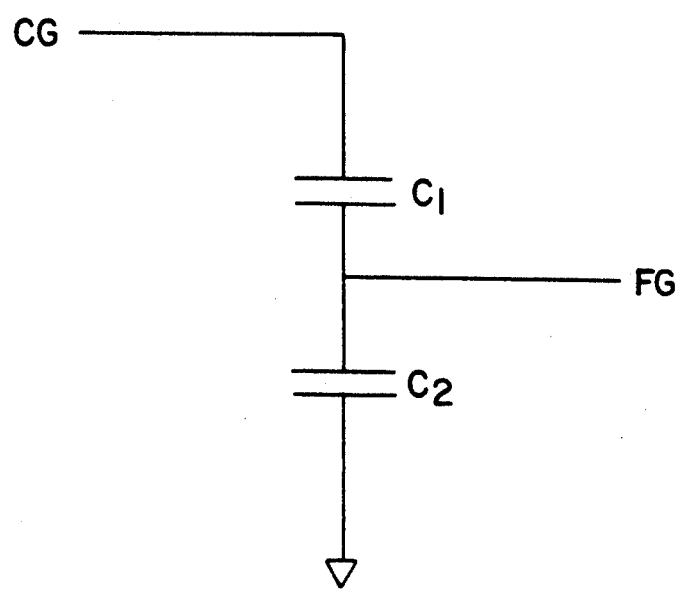
FIG. 3 is a simplified schematic diagram of a conventional capacitive divider network.

As shown in FIG. 1 a typical floating gate memory device 10 programmable in accordance with this invention includes a gate 12 to which electrical potential can be applied via gate lead 14, a write or programming channel 30 connected between a programming source 32 and a programming drain 34, and a read channel 40 connected between a read source 42 and a read drain 44. Device 10 also includes floating gate 20 which is not an externally accessible electrode (i.e., potential cannot be directly applied to floating gate 20).

During conventional programming a relatively high voltage such as 15 volts is applied to gate 12 via lead 14, a somewhat lower voltage such as 8 volts is applied to programming drain 34, programming source 32 is connected to ground (0 volts), and read source 42 and drain 44 are not used and are customarily connected to ground. The inherent capacitive coupling between gate 12 and floating gate 20 initially raises the potential of floating gate 20 to a predetermined fraction of the gate 12 potential. For example, the potential of floating gate 20 may initially be approximately 0.7 times the gate 12 potential (e.g., 10.5 volts). Some of the electrons flowing through channel 30 are consequently injected onto floating gate 20 and remain there, thereby lowering the potential of the floating gate and leaving a negative charge on the floating gate. If, as is desired, this negative charge is large enough, it makes it impossible for either 0 or 5 volts on gate 12 during normal logical operation of the device to raise the potential on floating gate 20 high enough for the floating poly transistor to turn on. The floating poly transistor has a threshold voltage of about 1 volt, so floating gate 20 would need to rise from −4 volts to 1 volt just to begin to allow the read channel to begin to conduct. This would require gate 12 to rise by $0+(1-(-4))/0.7$ or 7.1 volts. Because 7.1 volts is outside of the 5 volt operating range of the circuit in end use, the transistor effectively cannot be turned on. During such end use or normal operation, read source 42 is connected to ground (0 volts), 5 volts is applied to read drain 44, write channel 30 is not used (i.e., its source 32 and drain 34 are connected to ground), and gate 12 is switched between 0 volts and 5 volts. A "programmed" device 10 therefore remains off at all times during normal logical operation. If device 10 is left "unprogrammed" (i.e., no charge is put on floating gate 20), then during normal logical operation, read channel 40 is off when gate 12 is at 0 volts and on (i.e., conducting) when gate 12 is at 5 volts. In the case of an unprogrammed device, a 5 volt rise on gate 12 results in a potential of $0+0.7(5)=3.5$ volts on the floating gate. Because this is greater than the 1 volt threshold voltage of the floating poly transistor, the transistor conducts.

Device 10 must be at least a predetermined minimum size in order to be able to withstand the relatively high voltage (e.g., 15 volts) conventionally used during programming. These size limitations are both vertical dimensions (dielectric thicknesses) and planar dimensions such as channel length and spacings of electrodes. The dielectric thicknesses are limited by dielectric breakdown (units are volts/cm) when the voltage divided by the thickness exceeds about $10^7$ volts/cm. The lateral dimensions are limited by the process technology limitations, but the larger the voltage difference between two diffusions, the larger the space required between them. If the above-mentioned relatively high voltage is not used during conventional programming, floating gate 20 cannot be made to store sufficient charge to prevent read channel 40 from conducting when gate 12 is raised to 5 volts during normal logical operation. The need to program device 10 has therefore heretofore limited the device size reductions available.

The present invention makes it possible to substantially lower the programming voltage which must be applied to gate 12 in order to raise floating gate 20 to the potential required to attract sufficient hot electrons to program the device. This is accomplished by applying a positive voltage to read source 42 and read drain 44 during programming. The inherent capacitive coupling between read channel 40 and floating gate 20 adds to the inherent capacitive coupling between gate 12 and floating gate 20. Accordingly, the programming potential applied to elements 42 and 44 allows the programming potential applied to gate 12 to be reduced, thereby allowing device 10 to be made smaller than would otherwise be possible.

FIG. 2 is a table showing various illustrative values of $V_G$ (the potential applied to gate 12), V4244 (the potential applied to read source 42 and read drain 44 in accordance with this invention), and the resulting V20 (the potential on floating gate 20) during programming, on the assumption that the inherent capacitive coupling between elements 12 and 20 is a factor of 0.7 and the inherent capacitive coupling between elements 20 and 40 is 0.3. (In all cases the conventional voltages described above are applied to write source 32 and write drain 34.) The first line in FIG. 2 shows the conventional strategy of applying 15 volts to gate 12 and not using read channel 40 during programming. The resulting initial potential on floating gate 20 is therefore 10.5 volts, which, as described above, produces satisfactory programming of device 10.

The second line of FIG. 2 is an example of programming in accordance with this invention. The potential applied to gate 12 is reduced to 12.5 volts. The potential applied to read source 42 and read drain 44 is 5 volts. The resulting initial potential on floating gate 20 is therefore $(12.5)(0.7)+(5)(0.3)=10.25$ volts, which again produces satisfactory programming of device 10.

The third line of FIG. 2 shows another example of programming in accordance with this invention. In this example, 11 volts is applied to gate 12 and 8 volts is applied to read source 42 and read drain 44. The resulting initial potential on floating gate 20 is 10.1 volts, which will again produce satisfactory programming of device 10.

It will be understood that the inherent capacitive coupling factors (assumed to be 0.7 and 0.3 above) may vary, and that this may make it possible to use different values and/or combinations of $V_G$ and V4244 in accordance with this invention to produce satisfactory programming of device 10. It will also be noted that the principles of this invention can alternatively or additionally be used to shorten the time required to program device 12. This is illustrated by the fourth line of FIG. 2 where the conventional programming voltage (15 volts) applied to gate 12 is supplemented by a voltage (e.g., 5 volts) applied to read source 42 and read drain 44. The resulting 12 volts on floating gate 20 causes the floating gate to charge much faster than the conventional 10.5 volts (FIG. 2, first line). Programming time may be reduced by a factor on the order of 5 (i.e., only one-fifth the programming time may be required) or 10 (i.e., only one-tenth the programming time may be required) in this way. Various combinations of reduced programming voltage and reduced programming time may also be employed. For example, the fifth line of FIG. 2 shows the use of 14 volts applied to gate 12 with 5 volts applied to read source 42 and read drain 44 to produce an initial potential of 11.3 volts on floating gate 20. As compared to conventional programming (FIG. 2, line 1), this is a one-volt decrease in programming potential, combined with considerably faster programming (because V20 is initially substantially higher).

It will be understood that the foregoing is merely illustrative of the principles of this invention and that various modifications can be made by those skilled in the art without departing from the scope and spirit of the invention. For example, various other capacitive coupling factors will make possible various other combinations of $V_G$, V4244, and V20.

I claim:

1. The method of programming a floating gate memory device having a gate terminal, a programming channel connected between a programming source terminal and a programming drain terminal, a read channel connected between a read source terminal and a read drain terminal, and a floating gate capacitively coupled to said gate terminal and to said read channel, said method comprising the at least partly concurrent steps of:

applying a first programming voltage to said gate terminal;

applying a second programming voltage to said programming source terminal;

applying a third programming voltage to said programming drain terminal;

applying a fourth programming voltage to said read source terminal; and applying a fifth programming voltage to said read drain terminal, wherein all of said first, third, fourth, and fifth programming voltages are different from said second programming voltage, and wherein all of said first, third, fourth, and fifth programming voltages have the same predetermined polarity relative to said second programming voltage.

2. The method defined in claim 1 wherein said second programming voltage is ground potential and all of said first, third, fourth, and fifth programming voltages are positive relative to said ground potential.

3. The method defined in claim 1 wherein said fourth and fifth programming voltages are substantially the same.

4. The method defined in claim 2 wherein said first programming voltage is greater than said third programming voltage, and wherein said third programming voltage is greater than said fourth and fifth programming voltages.

5. The method defined in claim 4 wherein said fourth and fifth programming voltages are substantially equal.

6. The method defined in claim 1 wherein said device is a MOS EPROM device, wherein said first, third, fourth, and fifth programming voltages are positive, and wherein said second programming voltage is ground potential.

7. The method defined in claim 6 wherein said first programming voltage is greater than said third programming voltage, and wherein said fourth and fifth programming voltages are substantially equal.

8. The method defined in claim 7 wherein said fourth and fifth programming voltages are less than said third programming voltage.

9. The method defined in claim 8 wherein said first programming voltage is approximately 15 volts, wherein said second programming voltage is approximately 8 volts, and wherein said fourth and fifth programming voltages are approximately 5 volts.

10. The method defined in claim 8 wherein said first programming voltage is substantially less than 15 volts, wherein said third programming voltage is approximately 8 volts, and wherein said fourth and fifth programming voltages are approximately 5 volts.

11. The method defined in claim 10 wherein said first programming voltage is at least one volt less than 15 volts.

12. The method defined in claim 1 wherein the initial voltage of said floating gate as a result of performance of said applying steps is approximately equal to the initial voltage of said floating gate when said device is programmed in a conventional manner with the same voltage applied to the read source terminal and the read drain terminal as is applied to said programming source terminal.

13. The method defined in claim 1 wherein the initial voltage of said floating gate as a result of performance of said applying steps is greater than the initial voltage of said floating gate when said device is programmed in a conventional manner with the same voltage applied to the read source terminal and the read drain terminal as is applied to said programming source terminal.

14. The method of programming a MOS EPROM having a gate terminal, a programming channel connected between a programming source terminal and a programming drain terminal, a read channel connected between a read source terminal and a read drain terminal, and a floating gate capacitively coupled to said gate terminal and to said read channel, said method comprising the at least partly concurrent steps of:

applying ground potential to said programming source terminal;

applying a first positive voltage to said gate terminal;

applying a second positive voltage to said programming drain terminal; and applying a third positive voltage to said read source terminal and said read drain terminal, all of said first, second, and third positive voltages being different from said ground potential and of positive polarity relative to said ground potential.

15. The method defined in claim 14 wherein said second positive voltage is less than said first positive voltage but more than said third positive voltage.

* * * * *